United States Patent
Lee et al.

(10) Patent No.: US 10,600,985 B2
(45) Date of Patent: Mar. 24, 2020

(54) ORGANIC ELECTROLUMINESCENCE DISPLAY APPARATUS

(71) Applicant: Samsung Display Co., Ltd., Yongin-si, Gyeonggi-do (KR)

(72) Inventors: Junewoo Lee, Yongin-si (KR); Byoungseong Jeong, Suwon-si (KR); Ji-hyun Kim, Seongnam-si (KR); Younghee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 15/839,652

(22) Filed: Dec. 12, 2017

(65) Prior Publication Data

US 2018/0331316 A1    Nov. 15, 2018

(30) Foreign Application Priority Data

May 15, 2017    (KR) .................. 10-2017-0060144

(51) Int. Cl.
*H01L 51/52* (2006.01)
*H01L 27/32* (2006.01)
*H01L 51/50* (2006.01)

(52) U.S. Cl.
CPC ...... *H01L 51/5203* (2013.01); *H01L 27/3246* (2013.01); *H01L 27/3258* (2013.01);
(Continued)

(58) Field of Classification Search
CPC ............. H01L 51/5203; H01L 27/3246; H01L 27/3258; H01L 51/5036
See application file for complete search history.

(56) References Cited

U.S. PATENT DOCUMENTS

2006/0284532 A1* 12/2006 Kurihara .......... G02F 1/133617
313/110
2014/0291648 A1* 10/2014 Yamazaki .......... H01L 27/3246
257/40
(Continued)

FOREIGN PATENT DOCUMENTS

JP    2014-209480 A    11/2014
KR    10-0546661 B1    1/2006
(Continued)

*Primary Examiner* — Thao X Lee
*Assistant Examiner* — Xia L Cross
(74) *Attorney, Agent, or Firm* — Lewis Roca Rothgerber Christie LLP

(57) ABSTRACT

An organic electroluminescence display apparatus includes: an insulating layer including a flat surface, a first concave surface and a second concave surface extending from one end and another end of the flat surface, respectively; a first electrode on the insulating layer and including a first concave electrode surface overlapping with the first concave surface, a second concave electrode surface overlapping with the second concave surface, and a flat electrode surface overlapping with the flat surface; an organic layer on the first electrode; a second electrode on the organic layer, and a plurality of light shielding members on the second electrode with an opening therebetween, the opening overlapping with the organic layer. One end of each of the light shielding members is closer to the second concave surface than to the first concave surface.

13 Claims, 7 Drawing Sheets

(52) U.S. Cl.
CPC ........ *H01L 51/5036* (2013.01); *H01L 51/524* (2013.01); *H01L 51/5284* (2013.01); *H01L 27/322* (2013.01)

(56) References Cited

U.S. PATENT DOCUMENTS

2015/0102330 A1*  4/2015  Carter ................ H01L 51/0039
                                                              257/40
2016/0163768 A1   6/2016  Song et al.

FOREIGN PATENT DOCUMENTS

| | | |
|---|---|---|
| KR | 10-0709194 B1 | 4/2007 |
| KR | 10-2009-0021709 A | 3/2009 |
| KR | 10-2013-0008892 A | 1/2013 |
| KR | 10-2016-0070272 A | 6/2016 |

* cited by examiner

ORGANIC ELECTROLUMINESCENCE DISPLAY APPARATUS

CROSS-REFERENCE TO RELATED APPLICATION

This application claims priority to and the benefit of Korean Patent Application No. 10-2017-0060144, filed on May 15, 2017 in the Korean Intellectual Property Office, the entire content of which is herein incorporated by reference.

BACKGROUND

1. Field

Aspects of embodiments of the invention relate to an organic electroluminescence display apparatus.

2. Description of the Related Art

Various display apparatuses used in multimedia apparatuses, such as televisions, portable phones, tablet computers, navigation systems, and game consoles have been developed, and a self-luminous organic electroluminescence display apparatus has been developed as one kind of these display apparatuses. In the organic electroluminescence display apparatus, holes provided from a first electrode are recombined with electrons provided from a second electrode in a light-emitting layer to emit light. The organic electroluminescence display apparatus displays an image using the emitted light.

The organic electroluminescence display apparatus may have a structure in which an electrode and a light-emitting layer are stacked on an insulating layer referred to as a planarization layer. In this case, light emitted from the light-emitting layer may travel in parallel to a thickness direction of the organic electroluminescence display apparatus and may also be dispersed in both lateral directions. Thus, light efficiency of the organic electroluminescence display apparatus may be deteriorated, and lights of adjacent sub-pixels may be mixed with each other.

SUMMARY

According to an aspect of embodiments of the invention, an organic electroluminescence display apparatus has improved or increased light efficiency.

According to one or more embodiments, an organic electroluminescence display apparatus includes: an insulating layer including a flat surface and a first concave surface and a second concave surface extending from one end and another end of the flat surface, respectively; a first electrode disposed on the insulating layer and including a first concave electrode surface overlapping with the first concave surface, a second concave electrode surface overlapping with the second concave surface, and a flat electrode surface overlapping with the flat surface; an organic layer disposed on the first electrode; a second electrode disposed on the organic layer; and a plurality of light shielding members disposed on the second electrode and disposed with an opening therebetween, the opening overlapping with the organic layer. One end of a light shielding member of the plurality of light shielding members is opposite to the opening. A first shortest distance is defined from the one end of the light shielding member to a first boundary axis between the first concave surface and the flat surface, a second shortest distance is defined from another end of the light shielding member adjacent to the first concave surface to the first boundary axis, and a third shortest distance is defined from the insulating layer to the light shielding member. The first shortest distance is greater than twice the third shortest distance.

In one or more embodiments, the second shortest distance may be shorter than the first shortest distance.

In one or more embodiments, the first shortest distance and the third shortest distance may satisfy the following Equation 1:

$$\frac{X}{Y} > 2,$$

where "X" is the first shortest distance, and "Y" is the third shortest distance, and the third shortest distance may be fixed.

In one or more embodiments, the second shortest distance may be from 1 μm to 100 μm.

In one or more embodiments, a fourth shortest distance may be defined to correspond to a width of the opening, and a ratio of the second shortest distance to the fourth shortest distance may be greater than 0.005:1 and less than 0.5:1.

In one or more embodiments, a fifth shortest distance is defined from another end of the light shielding member adjacent to the second concave surface to a second boundary axis between the second concave surface and the flat surface, and a sixth shortest distance is defined from the one end of the light shielding member adjacent to the second concave surface to the second boundary axis. The sixth shortest distance is greater than twice the third shortest distance.

In one or more embodiments, the fifth shortest distance may be shorter than the sixth shortest distance.

In one or more embodiments, the organic electroluminescence display apparatus may further include a color conversion layer disposed on the second electrode and including an illuminant that absorbs first color light outputted from the organic layer and emits light having a color different from the first color light.

In one or more embodiments, the illuminant may include a first illuminant absorbing the first color light and emitting second color light, and a second illuminant absorbing the first color light and emitting third color light having a color different from the second color light.

In one or more embodiments, the color conversion layer may include a first conversion part including the first illuminant, a second conversion part including the second illuminant, and a third conversion part transmitting the first color light.

In one or more embodiments, the first, second, and third conversion parts may be spaced apart from each other in a plan view, and the light shielding members may be disposed between the first, second, and third conversion parts spaced apart from each other.

In one or more embodiments, the first color light may be blue light.

In one or more embodiments, the first concave surface and the second concave surface may be symmetrical with respect to the flat surface.

In one or more embodiments, the organic electroluminescence display apparatus may further include a pixel defining layer disposed on the insulating layer and exposing a portion of the first electrode overlapping with the organic layer.

BRIEF DESCRIPTION OF THE DRAWINGS

The above and other aspects and features of the present invention will become more apparent by describing in further detail some exemplary embodiments thereof with reference to the accompanying drawings, in which.

DETAILED DESCRIPTION

Figure 1:
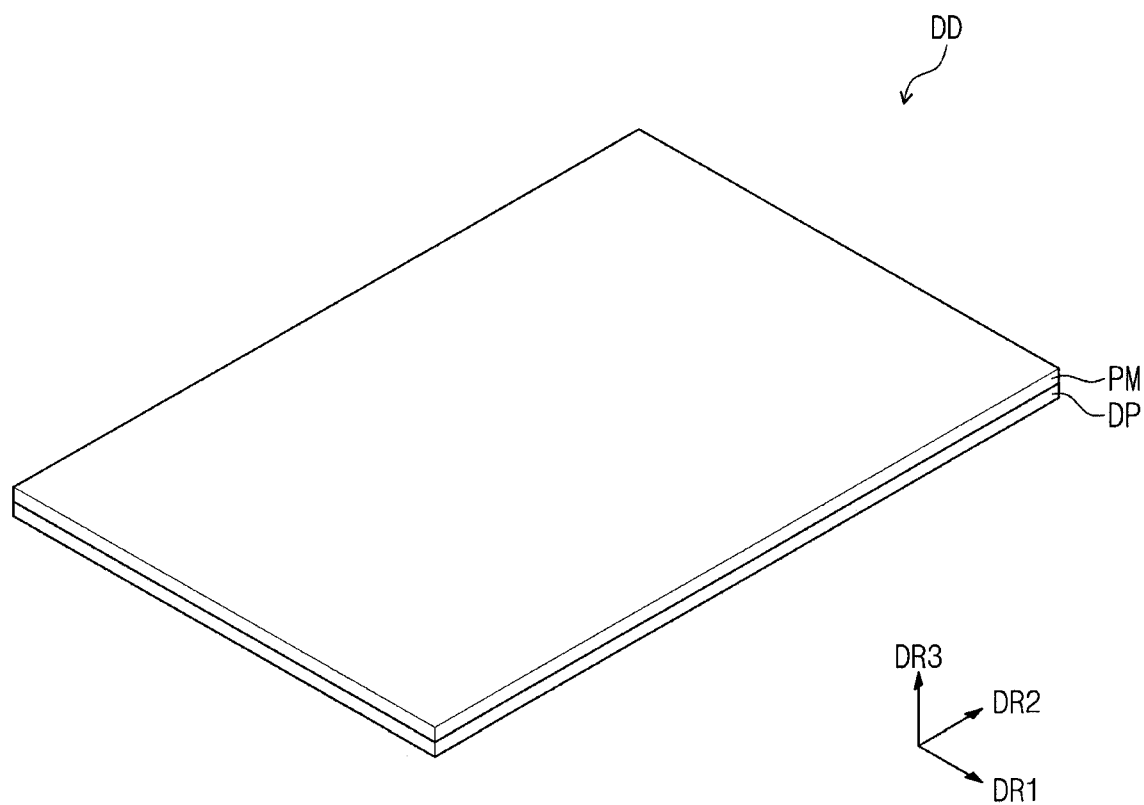
FIG. 1 is a perspective view illustrating an organic electroluminescence display apparatus according to one or more embodiments of the invention.

The invention now will be described more fully herein with reference to the accompanying drawings, in which some various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element, such as a layer, region, or substrate is referred to as being "on" another element, it can be directly on the other element or one or more intervening elements may be present. In contrast, the term "directly" means that there are no intervening elements. As used herein, the term "and/or" includes any and all combinations of one or more of the associated listed items. The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," etc. may be used herein to describe various elements, components, regions, layers, and/or sections, these elements, components, regions, layers, and/or sections should not be limited by these terms. Rather, these terms are used to distinguish one element, component, region, layer, or section from another element, component, region, layer, or section. Thus, a "first" element, component, region, layer, or section described below could be termed a "second" element, component, region, layer, or section without departing from the teachings herein.

Figure 2:
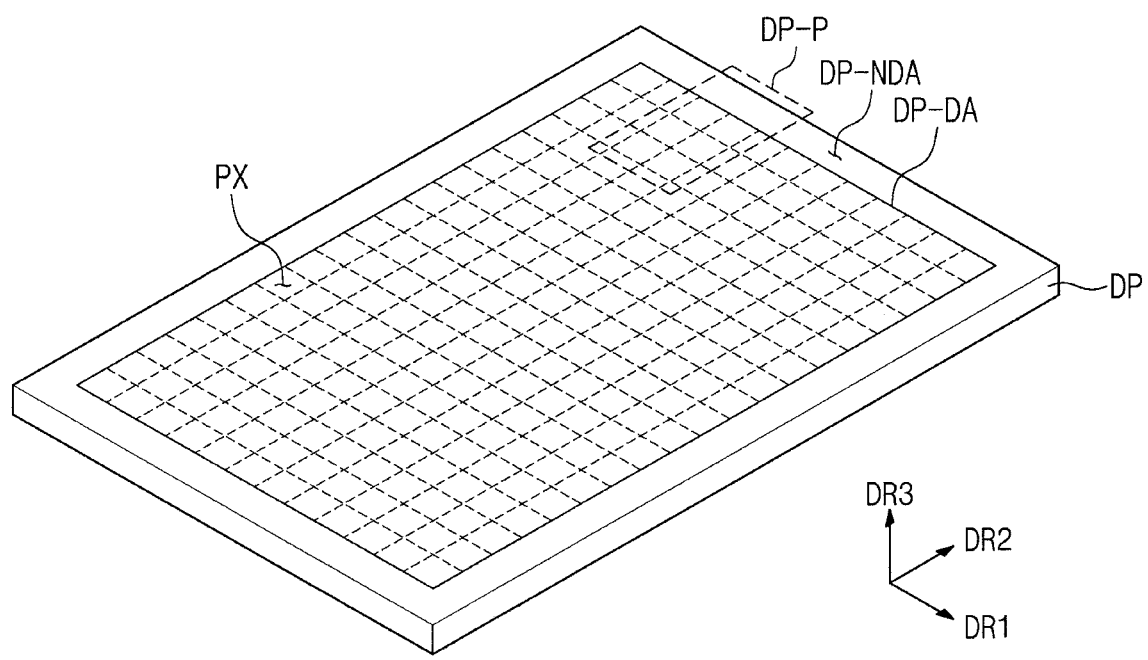
FIG. 2 is a perspective view illustrating a display panel of the organic electroluminescence display apparatus of FIG. 1.
Figure 3:
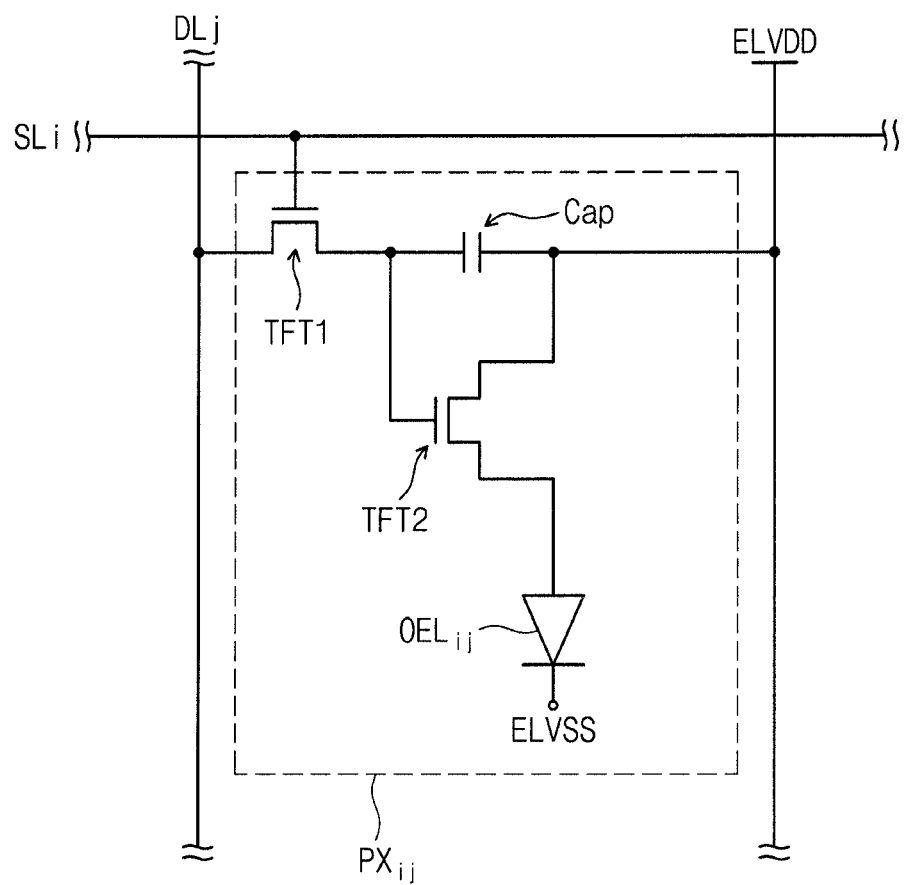
FIG. 3 is a circuit diagram illustrating an example of a pixel of the display panel of FIG. 2.
Figure 4:
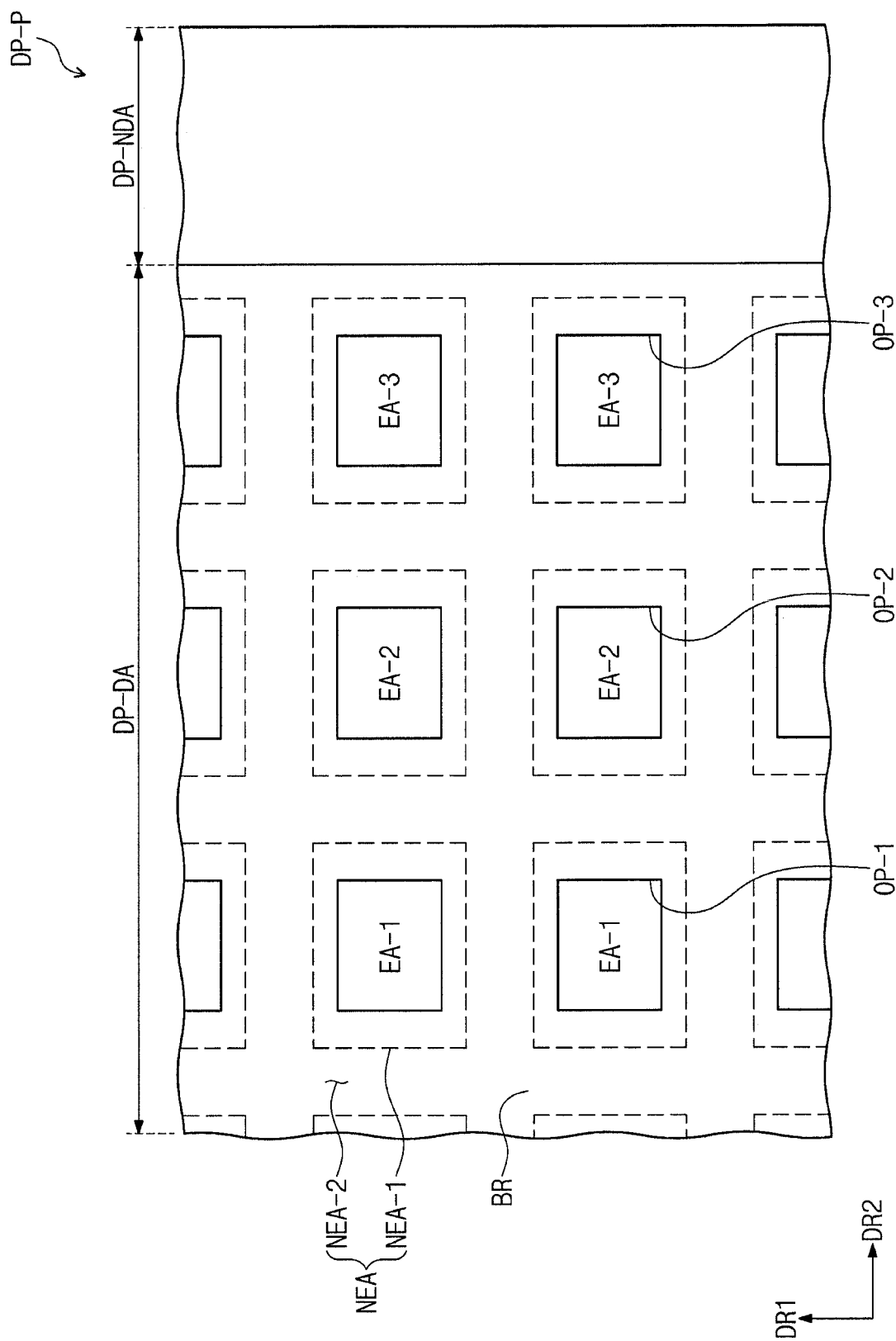
FIG. 4 is a partial plan view of the display panel illustrated in FIG. 2.

FIG. 1 is a perspective view illustrating an organic electroluminescence display apparatus according to one or more embodiments of the invention. FIG. 2 is a perspective view illustrating a display panel of the organic electroluminescence display apparatus of FIG. 1. FIG. 3 is a circuit diagram illustrating an example of a pixel of the display panel of FIG. 2. FIG. 4 is a partial plan view of the display panel illustrated in FIG. 2.

According to one or more embodiments of the invention, an organic electroluminescence display apparatus DD illustrated in FIG. 1 may be applied to a tablet personal computer, a smartphone, a personal digital assistant (PDA), a portable multimedia player (PMP), a game console, and a watch-type electronic device, for example. In addition, the organic electroluminescence display apparatus DD may also be applied to large-sized electronic devices (e.g., a television and/or an external billboard) and small and medium-sized electronic devices (e.g., a personal computer, a notebook computer, a car navigation unit, and/or a camera).

Referring to FIG. 1, the organic electroluminescence display apparatus DD may include a display panel DP and a protective member PM disposed on the display panel DP.

In one or more embodiments, the display panel DP may be an organic electroluminescence display panel. The protective member PM may be a support member supporting the display panel DP or a window member protecting the display panel DP.

The display panel DP is parallel to a plane defined by a first direction DR1 and a second direction DR2. A normal direction of the display panel DP is indicated by a third direction DR3. The third direction DR3 also indicates a thickness direction of the organic electroluminescence display apparatus DD. A top surface (or a front surface) and a bottom surface (or a back surface) of each of the members are defined by the third direction DR3. However, the directions DR1, DR2, and DR3 may be relative concepts and may be changed into other directions.

In an embodiment, the organic electroluminescence display apparatus DD is flat, as depicted in FIG. 1. However, the organic electroluminescence display apparatus DD according to the invention may be realized as a flexible display apparatus. In other words, components (e.g., the display panel DP and the protective member PM) included in the organic electroluminescence display apparatus DD may include flexible materials and can be bent, expanded, or pressed.

Referring to FIG. 2, the display panel DP may include a display area DP-DA, on which an image is displayed, and a non-display area DP-NDA adjacent to the display area DP-DA when viewed in a plan view. The display area DP-DA and the non-display area DP-NDA may be changed depending on a structure and/or a design of the display panel DP.

The display panel DP may include a plurality of pixels PX overlapping with the display area DP-DA. The pixels PX included in the display panel DP are shown to be arranged in a matrix form in FIG. 2. However, embodiments of the invention are not limited thereto. In certain embodiments, the pixels PX may be arranged in a non-matrix form, e.g., a pentile form. In addition, even though not shown in FIG. 2, the display panel DP may further include a plurality of gate lines and a plurality of data lines, which are connected to the plurality of pixels PX.

Referring to FIG. 3, each of the pixels PX receives a gate signal from a corresponding one of the gate lines and receives a data signal from a corresponding one of the data lines. Each of the pixels PX may be turned on in response to the corresponding gate signal and may generate light in response to the corresponding data signal to display an image.

Each of the pixels PX according to one or more embodiments of the invention includes at least one thin film transistor, at least one capacitor, and an organic electroluminescence element. FIG. 3 illustrates an equivalent circuit of a pixel $PX_{ij}$ connected to an i-th gate line SLi of the gate lines and a j-th data line DLj of the data lines.

The pixel $PX_{ij}$ includes a switching thin film transistor TFT1, a driving thin film transistor TFT2, a capacitor Cap, and an organic electroluminescence element $OEL_{ij}$. The switching thin film transistor TFT1 includes a control electrode connected to the i-th gate line SLi, an input electrode connected to the j-th data line DLj, and an output electrode. The switching thin film transistor TFT1 outputs the data signal, applied to the j-th data line DLj, in response to the gate signal applied to the i-th gate line SLi.

The capacitor Cap includes a first capacitor electrode connected to the switching thin film transistor TFT1, and a second capacitor electrode receiving a first power source voltage ELVDD. The capacitor Cap is charged with charges corresponding to a difference between the first power source voltage ELVDD and a voltage corresponding to the data signal received from the switching thin film transistor TFT1.

The driving thin film transistor TFT2 includes a control electrode connected to the output electrode of the switching thin film transistor TFT1 and the first capacitor electrode of the capacitor Cap, an input electrode receiving the first power source voltage ELVDD, and an output electrode. The output electrode of the driving thin film transistor TFT2 is connected to the organic electroluminescence element $OEL_{ij}$.

The driving thin film transistor TFT2 controls a driving current flowing through the organic electroluminescence element $OEL_{ij}$ in accordance with the amount of the charges stored in the capacitor Cap. A turn-on time of the driving thin film transistor TFT2 is determined depending on the amount of the charges stored in the capacitor Cap. The output electrode of the driving thin film transistor TFT2 may supply a voltage, a level of which is lower than that of the first power source voltage ELVDD, to the organic electroluminescence element $OEL_{ij}$.

The organic electroluminescence element $OEL_{ij}$ includes a first electrode connected to the driving thin film transistor TFT2, and a second electrode receiving a second power source voltage ELVSS. The organic electroluminescence element $OEL_{ij}$ may include a light-emitting pattern disposed between the first electrode and the second electrode.

The organic electroluminescence element $OEL_{ij}$ emits light during a turn-on period of the driving thin film transistor TFT2. A color of the light generated from the organic electroluminescence element $OEL_{ij}$ is determined by a material of the light-emitting pattern. According to one or more embodiments of the invention, the color of the light generated from the organic electroluminescence element $OEL_{ij}$ may be a blue color. In other words, the organic electroluminescence elements included in the plurality of pixels PX of the display panel DP according to the invention may be organic electroluminescence elements outputting blue light.

However, embodiments of the invention are not limited to the pixel $PX_{ij}$ illustrated in FIG. 3. In certain embodiments, the pixel $PX_{ij}$ may be variously changed. In other words, although the two thin film transistors TFT1 and TFT2, one capacitor Cap, and the organic electroluminescence element $OEL_{ij}$ are illustrated in the pixel $PX_{ij}$ of FIG. 3, the numbers of the components of the pixel and/or connection structures of the components may be variously modified.

Referring to FIG. 4, an enlarged view of an area DP-P of FIG. 2 is illustrated. A plurality of light emitting areas EA-1, EA-2, and EA-3 and a non-light emitting area NEA are defined in the display area DP-DA when viewed in a plan view defined by the first and second directions DR1 and DR2. In FIG. 4, three types of light emitting areas EA-1, EA-2, and EA-3 arranged in a matrix form are illustrated as an example. In one or more embodiments, the light emitting area EA-1 may output red light, the light emitting area EA-2 may output green light, and the light emitting area EA-3 may output blue light.

In the descriptions of the invention, emitting light of a predetermined color from a light emitting area may mean both that light generated from a corresponding electroluminescence element is emitted as it is and that a color of light generated from a corresponding electroluminescence element is converted and light having the converted color is emitted.

The non-light emitting area NEA may include first non-light emitting areas NEA-1 surrounding the light emitting areas EA-1 to EA-3, respectively, and a second non-light emitting area NEA-2 defining boundaries of the first non-light emitting areas NEA-1. The second non-light emitting area NEA-2 may be disposed between the first non-light emitting areas NEA-1. A driving circuit (e.g., the thin film transistors TFT1 and TFT2 and/or the capacitor Cap) of the pixel may be disposed in each of the first non-light emitting areas NEA-1. Signal lines (e.g., the gate lines and the data lines) electrically connected to the thin film transistors may be disposed in the second non-light emitting area NEA-2. However, embodiments of the invention are not limited thereto. In certain embodiments, the first non-light emitting areas NEA-1 and the second non-light emitting area NEA-2 may not be divided from each other.

Figure 5:
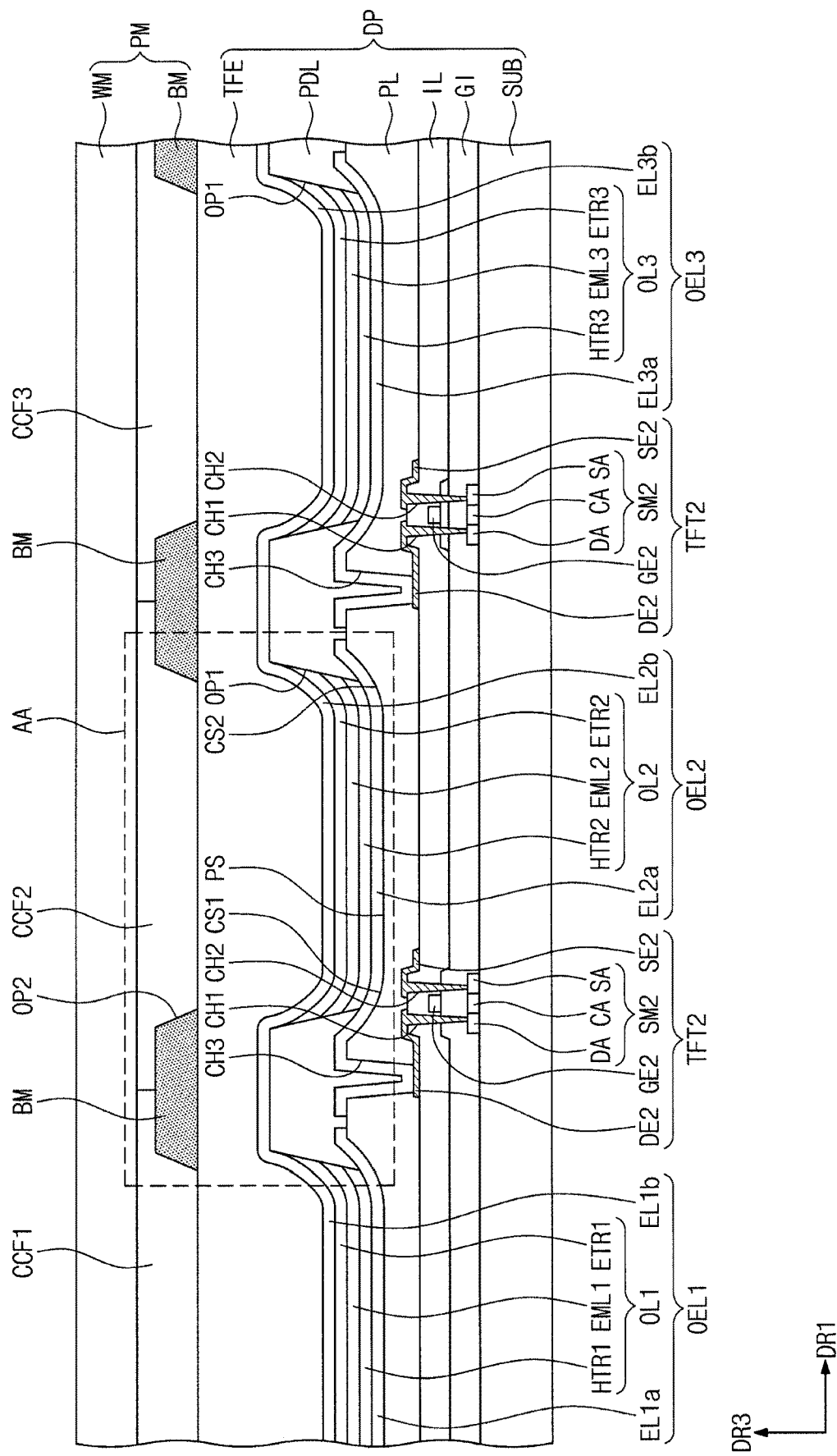
FIG. 5 is a partial cross-sectional view illustrating a display apparatus according to one or more embodiments of the invention.
Figure 6:
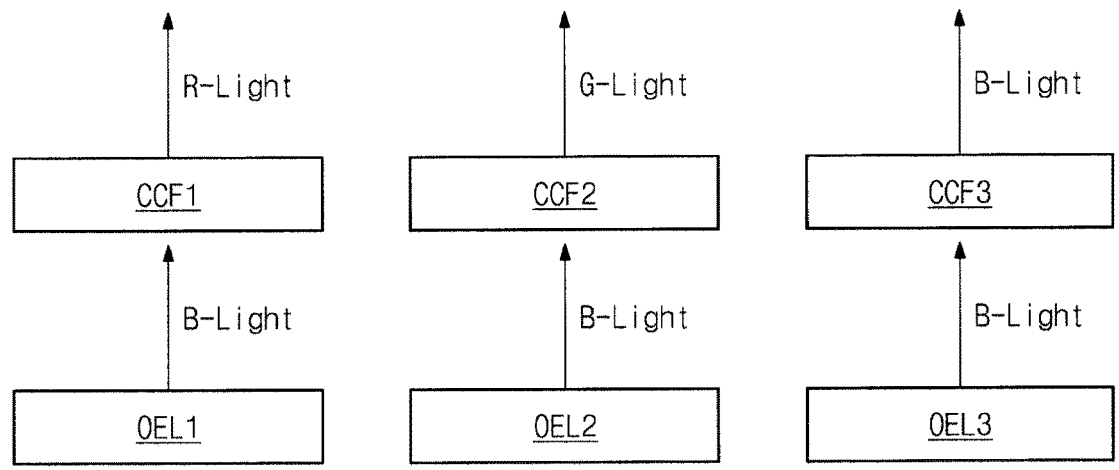
FIG. 6 illustrates conversion of light on the basis of first to third organic electroluminescence elements and first to third conversion parts of the display apparatus illustrated in FIG. 5.

FIG. 5 is a partial cross-sectional view illustrating a display apparatus according to one or more embodiments of the invention. FIG. 6 illustrates conversion of light on the basis of first to third organic electroluminescence elements and first to third conversion parts of the display apparatus illustrated in FIG. 5.

Referring to FIG. 5, a display panel DP may include a substrate SUB, and an organic electroluminescence element OEL may be disposed on the substrate SUB. In addition, the display panel DP may further include a sealing layer TFE formed on the organic electroluminescence element OEL.

The substrate SUB may use a general substrate known in the art, and may not be limited to a specific substrate. The substrate SUB may be a flexible substrate. The substrate SUB may be a glass substrate or a plastic substrate formed using a polymer resin. For example, the substrate SUB may include polyethylene terephthalate (PET), polyethylene naphthalate (PEN), polyimide, or polyethersulfone. The substrate SUB may be selected in consideration of one or more of mechanical strength, thermal stability, transparency, surface flatness, ease of handling, and waterproofing, for example. In one or more embodiments, the substrate SUB may be transparent. However, embodiments of the invention are not limited thereto.

A substrate buffer layer (not shown) may be provided on the substrate SUB. The substrate buffer layer (not shown) may prevent or substantially prevent impurities from being diffused into the switching thin film transistor TFT1 and the driving thin film transistor TFT2. In an embodiment, the substrate buffer layer (not shown) may be formed of silicon nitride ($SiN_x$), silicon oxide ($SiO_x$), and/or silicon oxynitride ($SiO_xN_y$). However, in one or more embodiments, the substrate buffer layer (not shown) may be omitted according to a material of the substrate SUB and a process condition.

A cross-sectional structure of the driving thin film transistor TFT2 among the switching and driving thin film transistors TFT1 and TFT2 of FIG. 3 is illustrated as an example in FIG. 5. According to the embodiment of FIG. 5, three organic electroluminescence elements OEL1 to OEL3 and two driving thin film transistors TFT2 are illustrated. Structures of the organic electroluminescence elements OEL1 to OEL3 may be substantially the same as each other, and, thus, one organic electroluminescence element will be described herein as an example. In addition, structures of the driving thin film transistors TFT2 may be substantially the same as each other, and, thus, one driving thin film transistor will be described as an example.

A second semiconductor pattern SM2 included in the driving thin film transistor TFT2 is provided on the substrate SUB. The second semiconductor pattern SM2 may be formed of a semiconductor material and may act as an active layer of the driving thin film transistor TFT2. The second semiconductor pattern SM2 includes a source portion SA, a drain portion DA, and a channel portion CA provided between the source portion SA and the drain portion DA. The second semiconductor pattern SM2 may be formed of an inorganic semiconductor or an organic semiconductor. The source portion SA and the drain portion DA may be doped with N-type dopants or P-type dopants.

Likewise, even though not shown in the drawings, a first semiconductor pattern included in the switching thin film transistor TFT1 may also be formed of a semiconductor material and may act as an active layer of the switching thin film transistor TFT1.

A gate insulating layer GI is provided on the second semiconductor pattern SM2. The gate insulating layer GI covers the second semiconductor pattern SM2. The gate insulating layer GI may be formed of an organic insulating material or an inorganic insulating material. A second gate electrode GE2 is provided on the gate insulating layer GI.

An interlayer insulating layer IL is provided on the second gate electrode GE2. The interlayer insulating layer IL covers the second gate electrode GE2. The interlayer insulating layer IL may be formed of an organic insulating material or an inorganic insulating material.

A second source electrode SE2 and a second drain electrode DE2 are provided on the interlayer insulating layer IL. The second drain electrode DE2 is in contact with the drain portion DA of the second semiconductor pattern SM2 through a first contact hole CH1 formed in the gate insulating layer GI and the interlayer insulating layer IL, and the second source electrode SE2 is in contact with the source portion SA of the second semiconductor pattern SM2 through a second contact hole CH2 formed in the gate insulating layer GI and the interlayer insulating layer IL.

An insulating layer PL is disposed on the substrate SUB. The insulating layer PL may cover the second source electrode SE2 and the second drain electrode DE2 and may be disposed on the interlayer insulating layer IL.

According to one or more embodiments of the invention, the insulating layer PL may include a concave area and a flat area. In more detail, the insulating layer PL has a bottom surface facing the interlayer insulating layer IL and a top surface opposite to the bottom surface of the insulating layer PL. In this case, the top surface of the insulating layer PL may include concave surfaces CS1 and CS2 corresponding to the concave area and a flat surface PS corresponding to the flat area. The concave surfaces CS1 and CS2 may be disposed with the flat surface PS interposed therebetween and may extend from one end and another end of the flat surface PS, respectively. The concave surfaces CS1 and CS2 may have shapes that are concave from the top surface of the insulating layer PL toward the substrate SUB.

The concave surfaces CS1 and CS2 and the flat surface PS included in the top surface of the insulating layer PL may overlap with the organic electroluminescence element OEL in the third direction DR3. In FIG. 5, the three organic electroluminescence elements OEL1 to OEL3 are illustrated. Thus, the top surface of the insulating layer PL illustrated in FIG. 5 may include the concave surfaces CS1 and CS2 and the flat surface PS, which overlap with each of the organic electroluminescence elements OEL1 to OEL3. In other words, the top surface of the insulating layer PL according to the invention may include the concave surfaces CS1 and CS2 and the flat surface PS, which overlap with each of a plurality of the organic electroluminescence elements included in the display panel DP.

The insulating layer PL may act as a protective layer that protects the driving thin film transistor TFT2. In addition, the insulating layer PL may also act as a planarization layer planarizing a top surface of a portion in which the driving thin film transistor TFT2 is disposed. For example, as illustrated in FIG. 5, a remaining portion of the insulating layer PL except the concave surfaces CS1 and CS2, the flat surface PS and a third contact hole CH3 may act as the planarization layer having the planarized top surface.

The organic electroluminescence elements OEL1 to OEL3 may be disposed on the insulating layer PL. Each of the organic electroluminescence elements OEL1 to OEL3 may include a first electrode EL1a, EL2a, or EL3a, an organic layer OL1, OL2, or OL3, and a second electrode EL1b, EL2b, or EL3b, which are sequentially stacked in the third direction DR3 corresponding to the thickness direction. Each of the organic layers OL1 to OL3 of the organic electroluminescence elements OEL1 to OEL3 may include a plurality of layers. For example, the organic layers OL1, OL2, and OL3 may include hole transfer regions HTR1, HTR2, and HTR3, light-emitting layers EML1, EML2, and EML3, and electron transfer regions ETR1, ETR2, and ETR3, respectively. Each of the organic layers OL1 to OL3 may be disposed in a first opening OP1 to be described later.

The first electrodes EL1a to EL3a may be disposed on the insulating layer PL. The first electrodes EL1a to EL3a have conductivity. The first electrodes EL1a to EL3a may be provided as anodes and may be pixel electrodes. The first electrodes EL1a to EL3a are connected to the second drain electrodes DE2 of the driving thin film transistors TFT2 through third contact holes CH3 formed in the insulating layer PL, respectively.

Each of the first electrodes EL1a to EL3a may include concave electrode surfaces overlapping with the concave surfaces CS1 and CS2 of the insulating layer PL, and a flat electrode surface overlapping with the flat surface PS of the insulating layer PL. Radii of curvature of the concave surfaces CS1 and CS2 of the insulating layer PL may be substantially equal to those of the concave electrode surfaces of each of the first electrodes EL1a to EL3a. However, embodiments of the invention are not limited thereto. In certain embodiments, the radii of curvature of the concave surfaces CS1 and CS2 of the insulating layer PL may be different from those of the concave electrode surfaces of each of the first electrodes EL1a to EL3a.

A pixel defining layer PDL may be disposed on the insulating layer PL. The pixel defining layer PDL may define first openings OP1, each of which exposes each of the first electrodes EL1a to EL3a in the concave area and the flat area of the insulating layer PL. A portion of the concave area of the insulating layer PL overlaps with the pixel defining layer PDL in FIG. 5. However, the first opening OP1 will be described herein as overlapping with the concave area and the flat area included in the insulating layer PL.

The pixel defining layer PDL may separate the organic layers OL1 to OL3 from each other in such a way that the organic layers OL1 to OL3 correspond to the pixels PX, respectively. The first opening OP1 of the pixel defining layer PDL may be defined to expose the concave electrode surfaces and the flat electrode surface of each of the first electrodes EL1a to EL3a, which are disposed on the concave surfaces CS1 and CS2 and the flat surface PS of the insulating layer PL.

In one or more embodiments, the pixel defining layer PDL may be formed of a polymer resin. For example, the pixel defining layer PDL may be formed to include a polyacrylate-based resin or a polyimide-based resin. In an embodiment, the pixel defining layer PDL may further include an inorganic material except the polymer resin. In one or more embodiments, the pixel defining layer PDL may include a light absorbing material or may include a black pigment or a black dye. The pixel defining layer PDL including the black pigment or the black dye may be realized as a black pixel defining layer. When the pixel defining layer PDL is formed, carbon black may be used as the black pigment or the black dye. However, embodiments of the invention are not limited thereto.

The organic layers OL1 to OL3 may be disposed on the first electrodes EL1a to EL3a, respectively. Each of the organic layers OL1 to OL3 may be disposed in the first opening OP1. The organic layers OL1 to OL3 may include the hole transfer regions HTR1 to HTR3 respectively disposed on the first electrodes EL1a to EL3a, the light-emitting layers EML1 to EML3 respectively disposed on the hole transfer regions HTR1 to HTR3, and the electron transfer regions ETR1 to ETR3 respectively disposed on the light-emitting layers EML1 to EML3.

According to one or more embodiments of the invention, the light-emitting layer EML may be formed of a material emitting blue light. In other words, each of the organic electroluminescence elements included in the display panel DP of the invention may include the light-emitting layer EML emitting the blue light.

The second electrodes EL1b to EL3b may be provided on the electron transfer regions ETR1 to ETR3, respectively. The second electrodes EL1b to EL3b may be a common electrode or a cathode. The second electrodes EL1b to EL3b may be formed of a metal alloy or a conductive compound. The second electrodes EL1b to EL3b may be transparent electrodes, semitransparent electrodes, or reflective electrodes. When the second electrodes EL1b to EL3b are the transparent electrodes, the second electrodes EL1b to EL3b may be formed of a transparent metal oxide, such as indium tin oxide (ITO), indium zinc oxide (IZO), zinc oxide (ZnO), or indium tin zinc oxide (ITZO).

When the second electrodes EL1b to EL3b are the semitransparent electrodes or the reflective electrodes, the second electrodes EL1b to EL3b may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). Alternatively, each of the second electrodes EL1b to EL3b may have a multi-layered structure that includes a reflective layer or semitransparent layer formed of the above-described material, and a transparent conductive layer formed of indium tin oxide (ITO), indium zinc oxide (IZO), zinc oxide (ZnO), or indium tin zinc oxide (ITZO).

In one or more embodiments, the first electrodes EL1a to EL3a may be the reflective electrodes, and the second electrodes EL1b to EL3b facing the first electrodes EL1a to EL3a may be the transparent electrodes. However, embodiments of the invention are not limited thereto.

The first electrodes EL1a to EL3a, the organic layers OL1 to OL3, and the second electrodes EL1b to EL3b, which constitute the organic electroluminescence elements OEL1 to OEL3 and are disposed in the first openings OP1, may include concave areas and flat areas corresponding to the concave areas and the flat area of the insulating layer PL.

According to one or more embodiments of the invention, each of the organic electroluminescence elements OEL1 to OEL3 may, to a greater degree, condense light to a second opening OP2 through its areas overlapping with the concave surfaces CS1 and CS2. In other words, light emitted from the organic electroluminescence elements OEL1 to OEL3 may be less condensed to a light shielding member BM disposed above the organic electroluminescence elements OEL1 to OEL3.

The sealing layer TFE may be provided on the second electrodes EL1b to EL3b. The sealing layer TFE may cover the second electrodes EL1b to EL3b. The sealing layer TFE may include at least one of an organic layer or an inorganic layer. In one or more embodiments, the sealing layer TFE may include at least one organic layer and at least one inorganic layer. The sealing layer TFE may include a plurality of layers.

The sealing layer TFE may be, for example, a thin film sealing layer. The sealing layer TFE protects the organic electroluminescence elements OEL1 to OEL3.

A plurality of light shielding members BM may be disposed on the sealing layer TFE. Second openings OP2 may be disposed between the light shielding members BM and may overlap with the organic layers OL1 to OL3. In one or more embodiments, the light shielding members BM may include an organic light shielding material or inorganic light shielding material including a black pigment or dye. The light shielding member BM may define a boundary between adjacent conversion parts and may prevent or substantially prevent lights, emitted from the organic layers OL1 to OL3, from being mixed with each other. In other words, the light shielding member BM may prevent or substantially prevent a light leakage phenomenon.

In one or more embodiments, the light shielding members BM may not be in contact with the pixel defining layer PDL and may be printed on an exposed top surface or bottom surface of the sealing layer TFE. In other embodiments, the light shielding members BM may be disposed over the pixel defining layer PDL. The light shielding members BM may be mainly disposed in an area in which the organic electroluminescence elements OEL1 to OEL3 are not disposed. In another embodiment, the sealing layer TFE may be omitted, and an additional sealing member may be disposed on the organic electroluminescence elements OEL1 to OEL3.

In addition, a color conversion layer may further be disposed on the sealing layer TFE. The color conversion layer may mainly overlap with the organic layers OL1 to OL3. The color conversion layer may include first to third conversion parts CCF1 to CCF3. The first to third conversion parts CCF1 to CCF3 may be arranged with the light shielding member BM interposed therebetween. In other words, the first conversion part CCF1 and the second conversion part CCF2 are disposed on the sealing layer TFE with the light shielding member BM interposed between the first and second conversion parts CCF1 and CCF2. In addition, the second conversion part CCF2 and the third conversion part CCF3 are disposed on the sealing layer TFE with the light shielding member BM interposed between the second and third conversion parts CCF2 and CCF3. The second conversion part CCF2 may be disposed between the first conversion part CCF1 and the third conversion part CCF3.

Referring to FIG. 6, the first conversion part CCF1 absorbs first color light emitted from a first organic layer OL1. The second conversion part CCF2 absorbs the first color light emitted from a second organic layer OL2. The third conversion part CCF3 absorbs the first color light emitted from a third organic layer OL3. Herein, the first color light which is blue light (B-light) will be described as an example.

According to one or more embodiments of the invention, the first conversion part CCF1 may include a first illuminant. The first illuminant may absorb the first color light from the first organic layer OL1 and may emit second color light. Here, the second color light may be red light (R-light). In other words, the first conversion part CCF1 may be a light emitting area that emits the red light.

The second conversion part CCF2 may include a second illuminant. The second illuminant may absorb the first color light from the second organic layer OL2 and may emit third color light. Here, the third color light may be green light (G-light). In other words, the second conversion part CCF2 may be a light emitting area that emits the green light.

The third conversion part CCF3 may not include an illuminant. In other words, the third conversion part CCF3 may be a light emitting area that absorbs the blue light (i.e. the first color light) from the third organic layer OL3 and emits the blue light as it is.

Referring again to FIG. 5, a window member WM is disposed on the color conversion layer. The window member WM may include a display surface through which an image is substantially displayed to the outside. In the present embodiment, the protective member PM includes the window member WM, the color conversion layer, and the light shielding member BM. However, embodiments of the invention are not limited thereto. In certain embodiments, these components may be individually provided.

Figure 7:
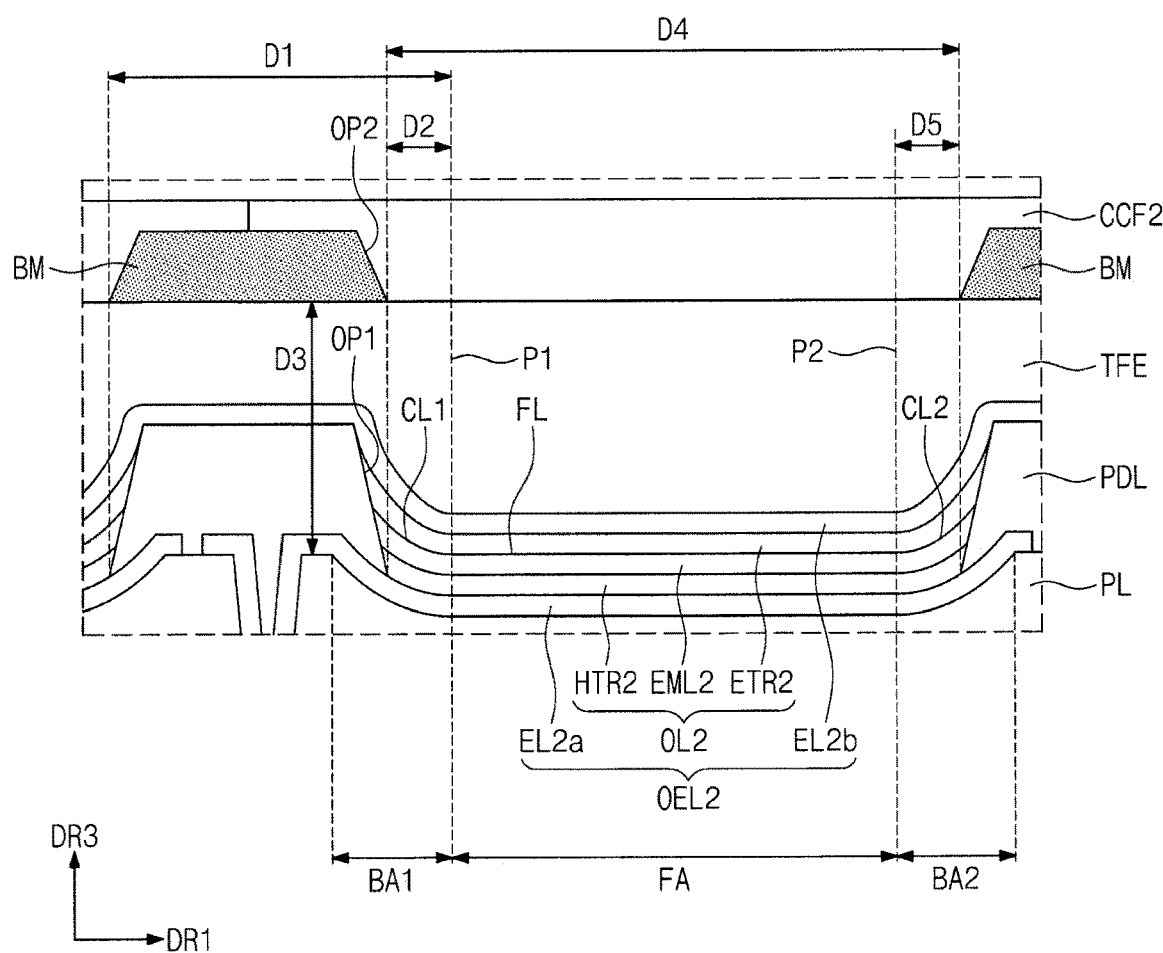
FIG. 7 is an enlarged view of a region "AA" of FIG. 5.
Figure 8:
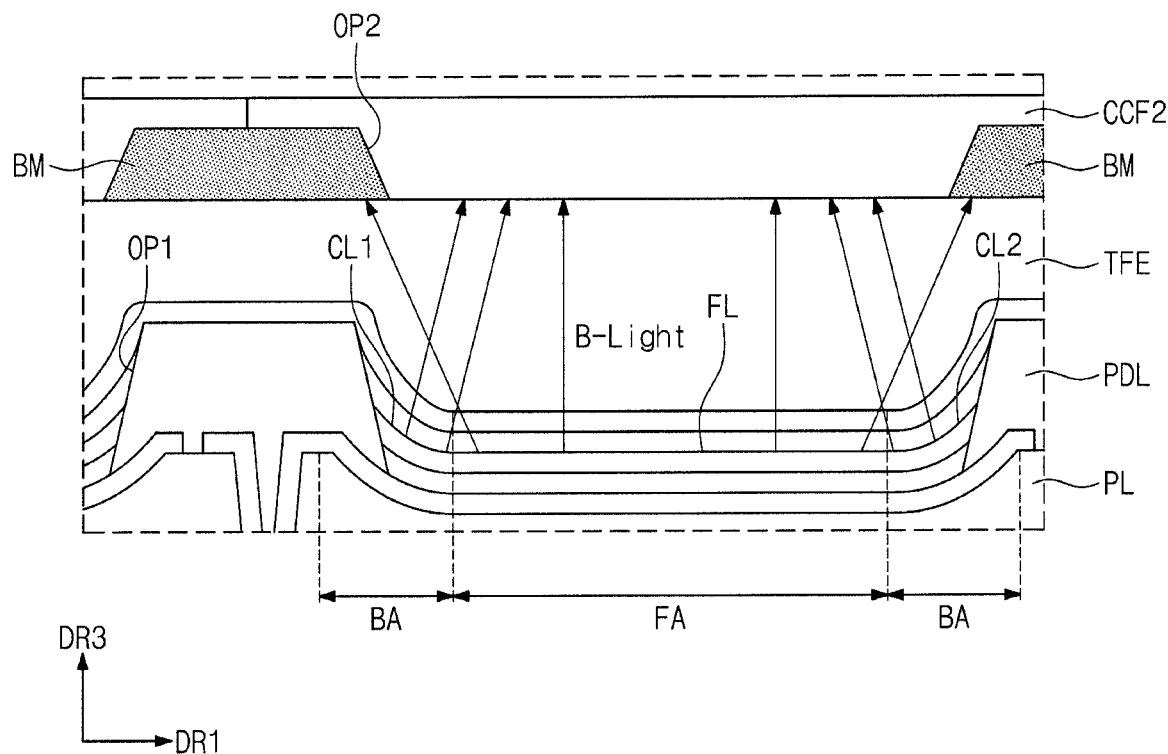
FIG. 8 is a cross-sectional view illustrating the travel of light emitted from an organic light-emitting layer according to one or more embodiments of the invention.
Figure 9:
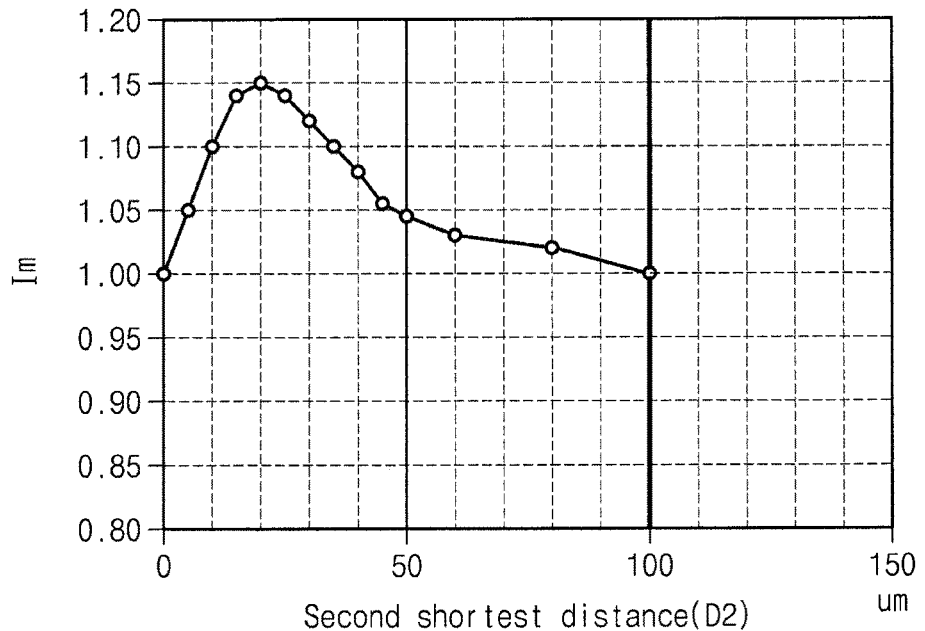
FIG. 9 is a graph illustrating a ratio of light transmitted from an organic light-emitting layer to a conversion part in accordance with a variation of a second shortest distance illustrated in FIG. 7.
Figure 10:
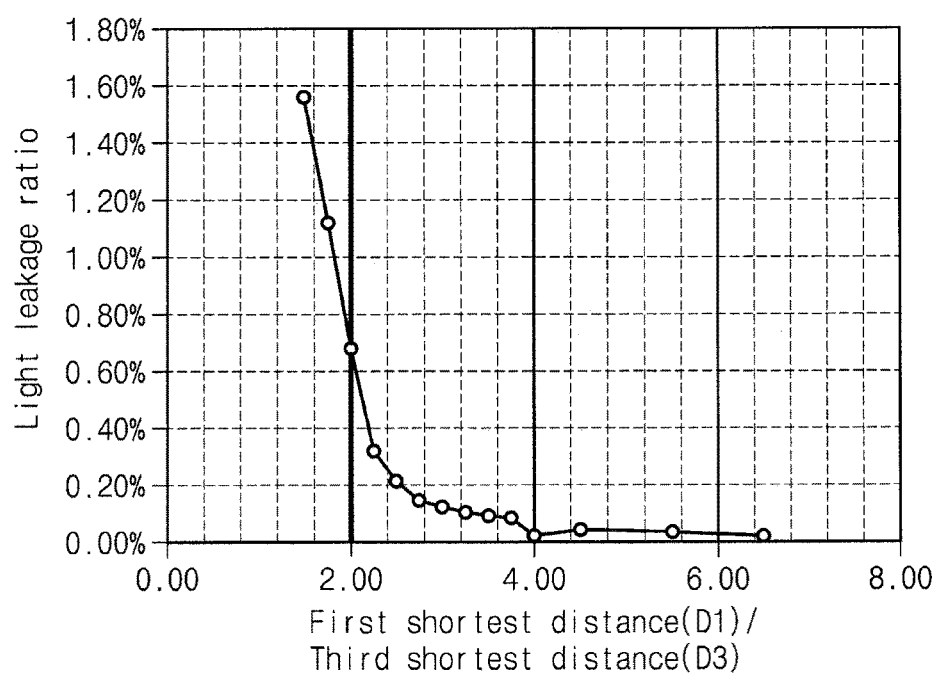
FIG. 10 is a graph illustrating a light leakage ratio according to variations of a first shortest distance and a third shortest distance illustrated in FIG. 7.

FIG. 7 is an enlarged view of a region "AA" of FIG. 5. FIG. 8 is a cross-sectional view illustrating the travel of light emitted from an organic light-emitting layer according to one or more embodiments of the invention. FIG. 9 is a graph illustrating a ratio of light transmitted from an organic light-emitting layer to a conversion part in accordance with a variation of a second shortest distance illustrated in FIG. 7. FIG. 10 is a graph illustrating a light leakage ratio according to variations of a first shortest distance and a third shortest distance illustrated in FIG. 7.

Referring to FIG. 7, as described with reference to FIG. 5, the top surface of the insulating layer PL includes a flat area FA and concave areas BA1 and BA2. The organic layer OL2 overlaps with the first opening OP1 and is disposed on the first electrode EL2a. The light-emitting layer EML2 includes a flat light emitting area FL overlapping with the flat area FA, and concave light emitting areas CL1 and CL2 overlapping with the concave areas BA1 and BA2.

According to the cross-sectional view of FIG. 8, most of light outputted or emitted from the flat light emitting area FL of the light-emitting layer EML2 may be condensed to the second conversion part CCF2. This may be because the flat light emitting area FL overlaps with a central portion of the second conversion part CCF2 as compared with the concave light emitting areas CL1 and CL2 extending with the flat light emitting area FL interposed therebetween. In other words, since a distance from the light shielding member BM to the flat light emitting area FL is greater than distances from the light shielding member BM to the concave light emitting areas CL1 and CL2, the light outputted from the flat light emitting area FL may be more condensed to the second conversion part CCF2 than light outputted from the concave light emitting areas CL1 and CL2.

In addition, even though the concave light emitting areas CL1 and CL2 are closer to the light shielding member BM than the flat light emitting area FL is, the light is emitted through concave surfaces of the concave light emitting areas CL1 and CL2, thereby improving or increasing efficiency of the light condensed to the second conversion part CCF2.

Referring again to FIG. 7, distance conditions between one light shielding member BM and the concave areas BA1 and BA2 and a distance condition between one light shielding member BM and the insulating layer PL will be described. These distance conditions may also be applied to the plurality of light shielding members BM. These distance conditions may be provided to further condense the light outputted from the light-emitting layer EML2 to the second conversion part CCF2.

In more detail, one end of the light shielding member BM is opposite to the second opening OP2 overlapping with the organic layer OL1, and another end of the light shielding member BM is adjacent to the second opening OP2 overlapping with the organic layer OL2.

A first shortest distance D1 is defined as the shortest distance from the one end of the light shielding member BM to a first boundary axis P1 between the concave area BA1 and the flat area FA. A second shortest distance D2 is defined as the shortest distance from the another end of the light shielding member BM to the first boundary axis P1. The second shortest distance D2 may be shorter than the first shortest distance D1. Here, the first boundary axis P1 may define a boundary between the flat surface and the concave surface of each of the insulating layer PL, the organic layer OL2, the first electrode EL2a and the second electrode EL2b.

A fifth shortest distance D5 is defined as the shortest distance from the another end of the light shielding member BM to a second boundary axis P2 between the concave area BA2 and the flat area FA. The fifth shortest distance D5 from the another end of the light shielding member BM to the second boundary axis P2 and the second shortest distance D2 from the another end of the light shielding member BM to the first boundary axis P1 may be the same.

Although not shown in FIG. 7, a sixth shortest distance is defined as the shortest distance from the one end of the light shielding member adjacent to the concave area BA2 to the second boundary axis P2. The sixth shortest distance is greater than twice the third shortest distance D3. Also, the fifth shortest distance D5 is shorter than the sixth shortest distance.

In addition, a third shortest distance D3 is defined as the shortest distance between the light shielding member BM and the insulating layer PL, and a fourth shortest distance D4 is defined as a width of the second opening OP2 between the light shielding members BM.

The first shortest distance D1 may be a sum of a width of the light shielding member BM in the first direction DR1 and the second shortest distance D2. In this case, the width of the light shielding member BM may be substantially constant, and the second shortest distance D2 may be varied.

Referring to the graph illustrated in FIG. 9, a horizontal axis represents the second shortest distance D2, and a unit of the second shortest distance D2 may be a micrometer (μm). A vertical axis represents a ratio of the amount (Im) of light condensed to the conversion part CCF2.

According to one or more embodiments of the invention, the second shortest distance D2 may be in a range from 1 μm to 100 μm. In this case, the third shortest distance D3 may be in a range from 10 μm to 20 μm. However, the third shortest distance is not limited to the range and may be changed according to one or more embodiments.

According to one or more embodiments of the invention, a ratio of the second shortest distance D2 to the fourth shortest distance D4 may be greater than 0.005:1 and less than 0.5:1.

When the second shortest distance D2 is 0 (zero), the amount of light condensed to the conversion part CCF2 may be a first ratio (1.00). When the second shortest distance D2 is 0, it is considered that there is no overlapping portion between the second opening OP2 and the concave light emitting areas CL1 and CL2. In other words, the light-emitting layer EML2 may include only the flat light emitting area FL.

Herein, the first ratio (1.00) may be defined as a reference ratio at which light is condensed to the conversion part CCF2. When the amount of the light condensed to the conversion part CCF2 is less than the reference ratio, the efficiency of the light condensed to the conversion part CCF2 may be reduced. When the amount of the light condensed to the conversion part CCF2 is greater than the reference ratio, the efficiency of the light condensed to the conversion part CCF2 may be increased.

When the third shortest distance D3 is a fixed value, the amount (Im) of the light may be changed as the second shortest distance D2 is varied. In other words, when the second shortest distance D2 increases, widths of the concave light emitting areas CL1 and CL2 in the first direction DR1 may increase.

However, if the second shortest distance D2 is greater than 100 μm, the amount of the light condensed to the conversion part CCF2 is less than the reference ratio, as illustrated in FIG. 9. This is because the widths of the concave light emitting areas CL1 and CL2 increase but a width of the flat light emitting area FL in the first direction DR1 decreases as the second shortest distance D2 increases. As a result, radii of curvature of the concave light emitting areas CL1 and CL2 may be increased to cause a light leakage phenomenon.

Thus, the second shortest distance D2 according to the invention may be in the range from 1 μm to 100 μm, as described above. As a result, it is possible to increase or improve the efficiency of the light condensed to the conversion part CCF2.

Referring to the graph illustrated in FIG. 10, a horizontal axis represents a ratio between the first shortest distance D1 and the third shortest distance D3. A vertical axis represents a light leakage ratio when light emitted from the light-emitting layer is transmitted to another conversion part not overlapping with the light-emitting layer, not the conversion part overlapping with the light-emitting layer.

According to one or more embodiments of the invention, the first shortest distance D1 and the third shortest distance D3 satisfy the following Equation 1:

$$\frac{X}{Y} > 2.$$

Here, "X" denotes the first shortest distance D1 and "Y" denotes the third shortest distance D3. In other words, the first shortest distance D1 may be greater than twice the third shortest distance D3. As shown in the graph of FIG. 10, when the ratio between the first and third shortest distances D1 and D3 based on the Equation 1 is greater than 2, the light leakage ratio is relatively low. By contrast, when the ratio between the first and third shortest distances D1 and D3 is equal to or less than 2, the light leakage ratio rapidly increases.

On the other hand, when the third shortest distance D3 is varied, the amount of the light condensed to the conversion part CCF2 may be changed according to distance setting between the first and third shortest distances D1 and D3. For example, light leakage of the light emitted from the light-emitting layer EML2 may increase as the third shortest distance D3 between the light shielding member BM and the insulating layer PL increases. By contrast, the light leakage of the light emitted from the light-emitting layer EML2 may decrease as the third shortest distance D3 between the light shielding member BM and the insulating layer PL decreases. As a result, the efficiency of the light condensed to the conversion part CCF2 may increase as the light leakage ratio decreases.

However, a plurality of layers may be disposed between the light shielding member BM and the insulating layer, and thus the third shortest distance D3 may increase. For example, even though not shown in the drawings, a filling material may further be disposed between the sealing layer TFE and the conversion part CCF2. In addition, the third shortest distance D3 may increase as a plurality of component layers is further disposed between the light shielding member BM and the insulating layer PL.

According to one or more embodiments of the invention, when the first shortest distance D1 is greater than twice the third shortest distance D3 on the basis of the Equation 1, the light leakage ratio is lowered, as illustrated in FIG. 10.

Since the first shortest distance D1 is defined as the sum of the width of the light shielding member BM in the first direction DR1 and the second shortest distance D2, a ratio of the second shortest distance D2 and the third shortest distance D3 may be substantially varied. However, embodiments of the invention are not limited thereto. In certain embodiments, the width of the light shielding member BM may also be varied.

In other words, when the ratio between the first and third shortest distances D1 and D3 is greater than 2 on the basis of the Equation 1, the efficiency of the light condensed to the conversion part may be increased or improved.

According to embodiments of the inventive concept, the display panel may include the electrode and the light-emitting layer which have the concave area and the flat area. As a result, it is possible to improve the extraction efficiency of the light outputted to the outside through the display surface.

While the invention has been described with reference to some example embodiments, it will be apparent to those skilled in the art that various changes and modifications may be made without departing from the spirit and scope of the invention. Therefore, it should be understood that the above embodiments are not limiting but, rather, are merely illustrative. Thus, the scope of the invention is to be determined by the broadest permissible interpretation of the following claims and their equivalents, and shall not be restricted or limited by the foregoing description.

What is claimed is:

1. An organic electroluminescence display apparatus comprising:
    a substrate;
    an insulating layer disposed on the substrate, the insulating layer comprising: a flat surface; and a first concave surface and a second concave surface extending from one end and another end of the flat surface, respectively;
    a first electrode on the insulating layer, the first electrode comprising: a first concave electrode surface overlapping with the first concave surface; a second concave electrode surface overlapping with the second concave surface; and a flat electrode surface overlapping with the flat surface;
    an organic layer on the first electrode;
    a second electrode on the organic layer; and
    a plurality of light shielding members on the second electrode and comprising a first light shielding member and a second light shielding member arranged with an opening therebetween, the opening overlapping with the organic layer,
    wherein one end of the first light shielding member is away from the opening,
    wherein a first shortest distance is defined as a shortest distance from the one end of the first light shielding member to a first boundary axis between the first concave surface and the flat surface, a second shortest distance is defined as a shortest distance from another end of the first light shielding member to the first boundary axis, the another end of the first light shielding member being adjacent to the opening, and a third shortest distance is defined as a shortest distance from the insulating layer to the first light shielding member, and
    wherein the first shortest distance is greater than twice the third shortest distance, and
    wherein the second shortest distance is from 1 μm to 100 μm.

2. The organic electroluminescence display apparatus of claim 1,
    wherein a fourth shortest distance is defined to correspond to a width of the opening, and
    wherein a ratio of the second shortest distance to the fourth shortest distance is greater than 0.005:1 and less than 0.5:1.

3. The organic electroluminescence display apparatus of claim 1,
    wherein a fifth shortest distance is defined as a shortest distance from an end of the second light shielding member to a second boundary axis between the second concave surface and the flat surface, the end of the second light shielding member being adjacent to the opening, and a sixth shortest distance is defined as a shortest distance from another end of the second light shielding member to the second boundary axis, the another end of the second light shielding member being away from the opening, and
    wherein the sixth shortest distance is greater than twice the third shortest distance.

4. The organic electroluminescence display apparatus of claim 3, wherein the fifth shortest distance is shorter than the sixth shortest distance.

5. The organic electroluminescence display apparatus of claim 1, further comprising:
    a color conversion layer on the second electrode and including an illuminant that absorbs first color light outputted from the organic layer and emits light having a color different from the first color light.

6. The organic electroluminescence display apparatus of claim 5, wherein the illuminant comprises:
    a first illuminant absorbing the first color light and emitting second color light; and
    a second illuminant absorbing the first color light and emitting third color light having a color different from the second color light.

7. The organic electroluminescence display apparatus of claim 6, wherein the color conversion layer comprises:
    a first conversion part including the first illuminant;
    a second conversion part including the second illuminant; and
    a third conversion part transmitting the first color light.

8. The organic electroluminescence display apparatus of claim 7,
    wherein the first, second, and third conversion parts are spaced apart from each other in a plan view, and
    wherein the light shielding members are arranged between the first, second, and third conversion parts spaced apart from each other.

9. The organic electroluminescence display apparatus of claim 5, wherein the first color light is blue light.

10. The organic electroluminescence display apparatus of claim 1, wherein the first concave surface and the second concave surface are symmetrical with respect to the flat surface.

11. The organic electroluminescence display apparatus of claim 1, further comprising:
    a pixel defining layer on the insulating layer and exposing a portion of the first electrode overlapping with the organic layer.

12. The organic electroluminescence display apparatus of claim 1, wherein the third shortest distance is less than a shortest distance from the flat surface to the first light shielding member.

13. An organic electroluminescence display apparatus comprising:
    a substrate;
    an insulating layer disposed on the substrate, the insulating layer comprising: a flat surface; and a first concave surface and a second concave surface extending from one end and another end of the flat surface, respectively;
    an organic light-emitting element disposed on the insulating layer;
    an encapsulation layer disposed on the organic light-emitting element; and
    a plurality of light shielding members on the encapsulation layer and comprising a first light shielding member and a second light shielding member arranged with an opening therebetween,
    wherein the flat surface overlaps the opening,
    wherein one end of the first light shielding member is away from the opening, wherein a first shortest distance is defined as a shortest distance from the one end of the first light shielding member to a first boundary axis between the first concave surface and the flat surface, a second shortest distance is defined as a shortest distance from another end of the first light shielding member to the first boundary axis, the another end of the first light shielding member being adjacent to the opening, and a third shortest distance is defined as a shortest distance from the insulating layer to the first light shielding member, and wherein the first shortest distance is greater than twice the third shortest distance, and wherein the second shortest distance is from 1 μm to 100 μm.

* * * * *